(12) United States Patent
Wan

(10) Patent No.: US 8,723,604 B2
(45) Date of Patent: May 13, 2014

(54) COMPENSATION TECHNIQUE FOR FEEDBACK AMPLIFIERS

(75) Inventor: Quan Wan, Belmont, MA (US)

(73) Assignee: Analog Devices, Inc., Norwood, MA (US)

( * ) Notice: Subject to any disclaimer, the term of this patent is extended or adjusted under 35 U.S.C. 154(b) by 42 days.

(21) Appl. No.: 13/464,311

(22) Filed: May 4, 2012

(65) Prior Publication Data

US 2013/0293293 A1    Nov. 7, 2013

(51) Int. Cl.
*H03F 1/14* (2006.01)

(52) U.S. Cl.
USPC .......................................... 330/292; 330/100

(58) Field of Classification Search
USPC .............. 330/98, 99, 100, 292, 107, 109, 294
See application file for complete search history.

(56) References Cited

U.S. PATENT DOCUMENTS

| | | | |
|---|---|---|---|
| 3,918,005 A | 11/1975 | Bruckenstein et al. | |
| 6,731,165 B1 | 5/2004 | Marz | |
| 7,002,409 B1 | 2/2006 | Aram | |
| 7,173,486 B1 | 2/2007 | Sutardja | |
| 7,696,820 B1 * | 4/2010 | Voo | ................ 330/109 |
| 2003/0169104 A1 | 9/2003 | Huckins et al. | |
| 2006/0202753 A1 | 9/2006 | Ferianz et al. | |
| 2008/0186091 A1 | 8/2008 | Corsi | |

FOREIGN PATENT DOCUMENTS

WO    WO 01/35526 A2    5/2001

OTHER PUBLICATIONS

International Search Report and Written Opinion for PCT/US2013/039195, Aug. 16, 2013, 13 pages.

* cited by examiner

*Primary Examiner* — Steven J Mottola
(74) *Attorney, Agent, or Firm* — Knobbe, Martens, Olson & Bear, LLP

(57) ABSTRACT

Compensation methods and systems for voltage-feedback amplifiers provide improved dynamic performance (i.e., increased bandwidth and the elimination or alleviation of a slew limitation) at high gains by direct feedback of an AC signal (i.e., an intermediate voltage) to an amplifier input without being attenuated by feedback resistor network.

15 Claims, 11 Drawing Sheets

| $R_F$ | Gain | $R_G$ | $A_2$ | β | BW | BW\* | BW\* ÷ BW |
|---|---|---|---|---|---|---|---|
| 50K | 1 | ∞ | 100 | 1 | 100K | 100K | 1 |
| 50K | 2 | 100K | 100 | 0.5 | 50K | 99K | 2 |
| 50K | 5 | 25K | 100 | 0.2 | 20K | 96K | 5 |
| 50K | 10 | 11.1K | 100 | 0.1 | 10K | 92K | 9 |
| 50K | 20 | 5.26K | 100 | 0.05 | 5K | 84K | 17 |
| 50K | 50 | 2.04K | 100 | 0.02 | 2K | 67K | 34 |
| 50K | 100 | 1.01K | 100 | 0.01 | 1K | 50.5K | 51 |
| 50K | 200 | 502.5 | 100 | 0.005 | 500 | 33.7K | 67 |
| 50K | 500 | 200.4 | 100 | 0.002 | 200 | 16.8K | 84 |
| 50K | 1000 | 100.1 | 100 | 0.001 | 100 | 9K | 92 |

FIG. 5

COMPENSATION TECHNIQUE FOR FEEDBACK AMPLIFIERS

TECHNICAL FIELD

Embodiments of the current invention related to amplifier circuits and, more particularly, to high-gain voltage-feedback amplifiers.

BACKGROUND

The dynamic performance of a voltage-feedback amplifier (i.e., its ability to accurately amplify time-varying signals) is limited by its gain-bandwidth product ("GBW") and slew rate. Because the GBW of a voltage amplifier is constant, the closed-loop bandwidth is inversely proportional to its gain; if a given amplifier is configured for a high gain, for example, its bandwidth correspondingly drops (sometimes dramatically). This drop in bandwidth may degrade the amplifier's performance, especially with high-frequency inputs. Some amplifiers (such as general-purpose instrumentation amplifiers) include an input/output port (e.g., pins on a chip package) to which a customizable gain-setting resistor ("$R_G$") may be connected; other amplifiers include a control port for digitally programming an internal $R_G$ value. A user may therefore select a desired gain value by varying the size of $R_G$ but, in doing so, deleteriously change the amplifier's bandwidth. FIG. 1 illustrates an exemplary three operational-amplifier ("op-amp") instrumentation amplifier 100 that includes first-level op-amps 102 (divided into first-stage $A_1$ and second-stage $A_2$ amplifiers) and a second-level op-amp 104.

If the gain is set to a high value, the resulting low bandwidth of the amplifier 100 may be increased by configuring other components in the circuit. For example, part of the amplifier's compensation capacitance 106 may be switched out (i.e., electrically disconnected from the circuit), thereby improving the high-frequency performance of the circuit. This adjustment, however, requires additional input/output ports for the control signals necessary to change the compensation capacitance 106; in the simplest case, one pin may be used to switch part of the capacitance 106 in or out, but more pins are required for finer-grained control. Many amplifiers, such as commercial general-purpose resistor-programmable instrumentation amplifiers, cannot provide these additional ports because they would increase the cost of the amplifier, the complexity of the control circuitry, and/or the size of the amplifier package. A current-feedback amplifier may be used for high-speed operation, because its dynamic performance is not limited by GBW and slew rate, but these amplifiers have lower DC gain and are thus not suitable for high-precision applications. A need therefore exists for a way of boosting the bandwidth of a voltage-feedback amplifier at high gains without requiring additional input/output ports.

SUMMARY

The compensation technique of the present invention extends the small-signal bandwidth of an amplifier while also eliminating/alleviating its slew limitation under a large-signal step response. In various embodiments, a compensation capacitance is connected between an intermediate node of the amplifier and a feedback input of the amplifier (e.g., an inverting input). This configuration thus provides two feedback paths for the feedback input: one path through an existing feedback loop and a second path from the compensation capacitance. This dual-path feedback technique feeds back more AC signal to the inverting input, effectively extending the closed-loop bandwidth of the amplifier.

In a first aspect, a system for extending a bandwidth and improving slew behavior of a feedback amplifier includes an amplifier and first and second feedback paths. The amplifier has an input node, an output node, and an intermediate node. The first feedback path provides, to the input node, a signal derived from an output voltage on the output node. The second feedback path provides, to the input node, a signal derived from an intermediate voltage on the intermediate node.

The second feedback path may include a compensation capacitor. The closed-loop 3 dB bandwidth of the amplifier may remain approximately constant at its unit-gain bandwidth, regardless of a gain setting of the amplifier, or it may be extended by a factor of $$\frac{1+A_2}{1+A_2\beta}$$

(wherein $\beta$ is the feedback coefficient and $A_2$ is the gain between the intermediate node and output node). The signal derived from the output voltage and the closed loop gain of the amplifier may depend on the ratio of a gain-setting resistor and the feedback resistor.

The amplifier may be a differential amplifier and may include an operational amplifier. The amplifier may include a first stage for amplifying an input voltage on the input node input voltage to produce the intermediate voltage on the intermediate node, and a second stage for amplifying the intermediate voltage to produce the output voltage. A second amplifier, which may be a unity-gain amplifier, may amplify and/or buffer the voltage on the output node; the amplifier and the second amplifier may include an instrumentation amplifier.

In another aspect, a method for extending a bandwidth of a feedback amplifier includes providing a first signal derived from an output voltage of an amplifier to an input node of the amplifier and providing a second signal derived from an intermediate voltage of the amplifier to an input node of the amplifier. The second signal increases a bandwidth of the feedback amplifier as a gain of the amplifier increases.

A first amplifier may provide a high input impedance and a second amplifier may provide and a unity gain. A gain of the feedback amplifier may be adjusted; adjusting the gain may include adjusting a resistance of a gain-setting resistor.

These and other objects, along with advantages and features of the present invention herein disclosed, will become more apparent through reference to the following description, the accompanying drawings, and the claims. Furthermore, it is to be understood that the features of the various embodiments described herein are not mutually exclusive and can exist in various combinations and permutations.

BRIEF DESCRIPTION OF THE DRAWINGS

In the drawings, like reference characters generally refer to the same parts throughout the different views. In the following description, various embodiments of the present invention are described with reference to the following drawings, in which:

FIG. 5 is a table of example bandwidth values in accordance with an embodiment of the invention;

DETAILED DESCRIPTION

Figure 2:
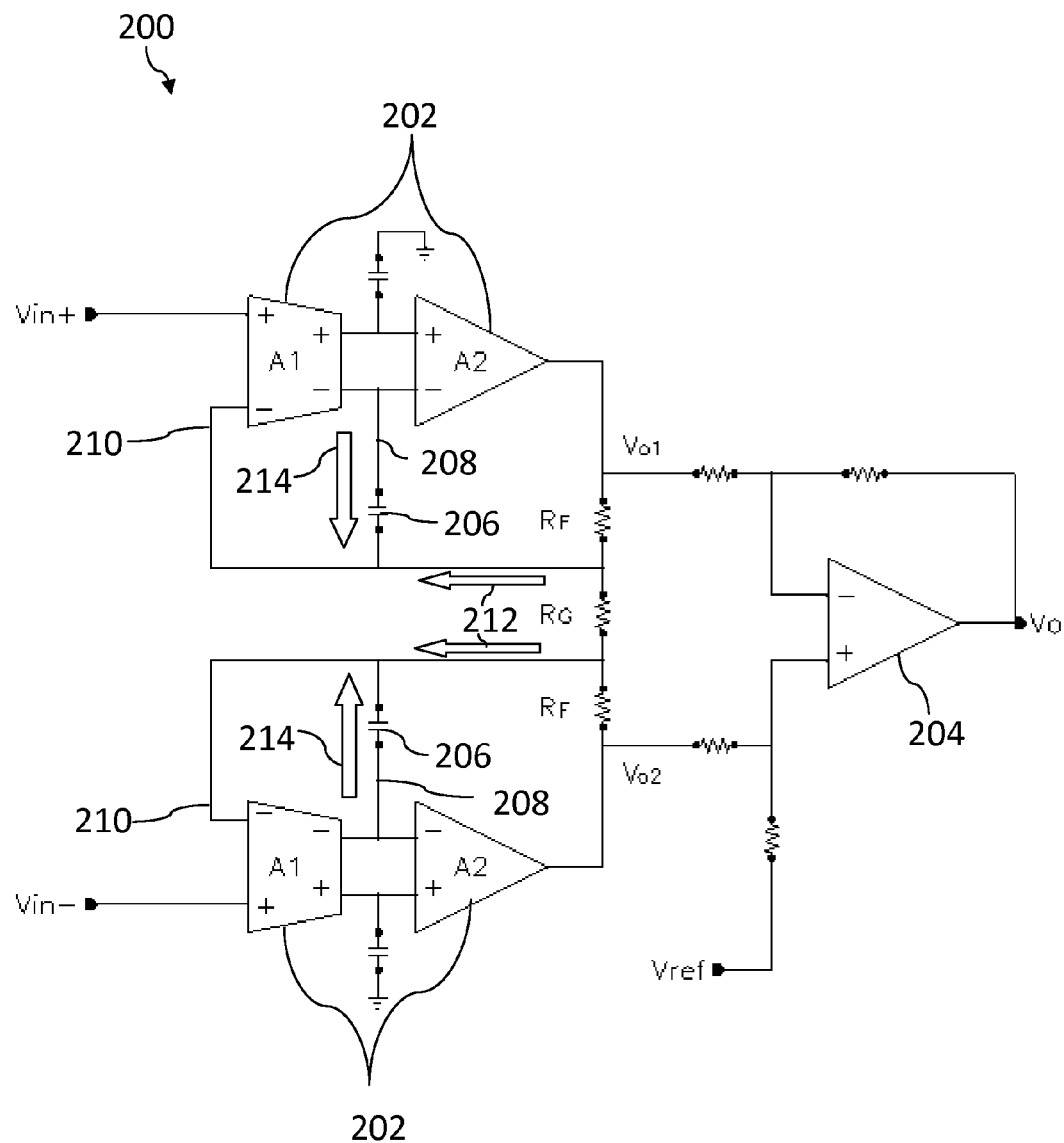
FIG. 2 illustrates a feedback circuit for an amplifier in accordance with an embodiment of the invention.

A three op-amp instrumentation amplifier 200 having an improved compensation scheme is shown in FIG. 2. The amplifier 200 has a differential first stage 202, but one of skill in the art will understand that the discussion herein applies to a single-ended first stage. Furthermore, because the two input stages $V_{in+}$, $V_{in-}$ are symmetric, the discussion herein refers to components in only one of the input stages $V_{in+}$, $V_{in-}$ for the sake of simplicity. A single output stage 204 is shown; the current invention is not, however, limited to any particular number of amplification and/or output stages.

Figure 1:
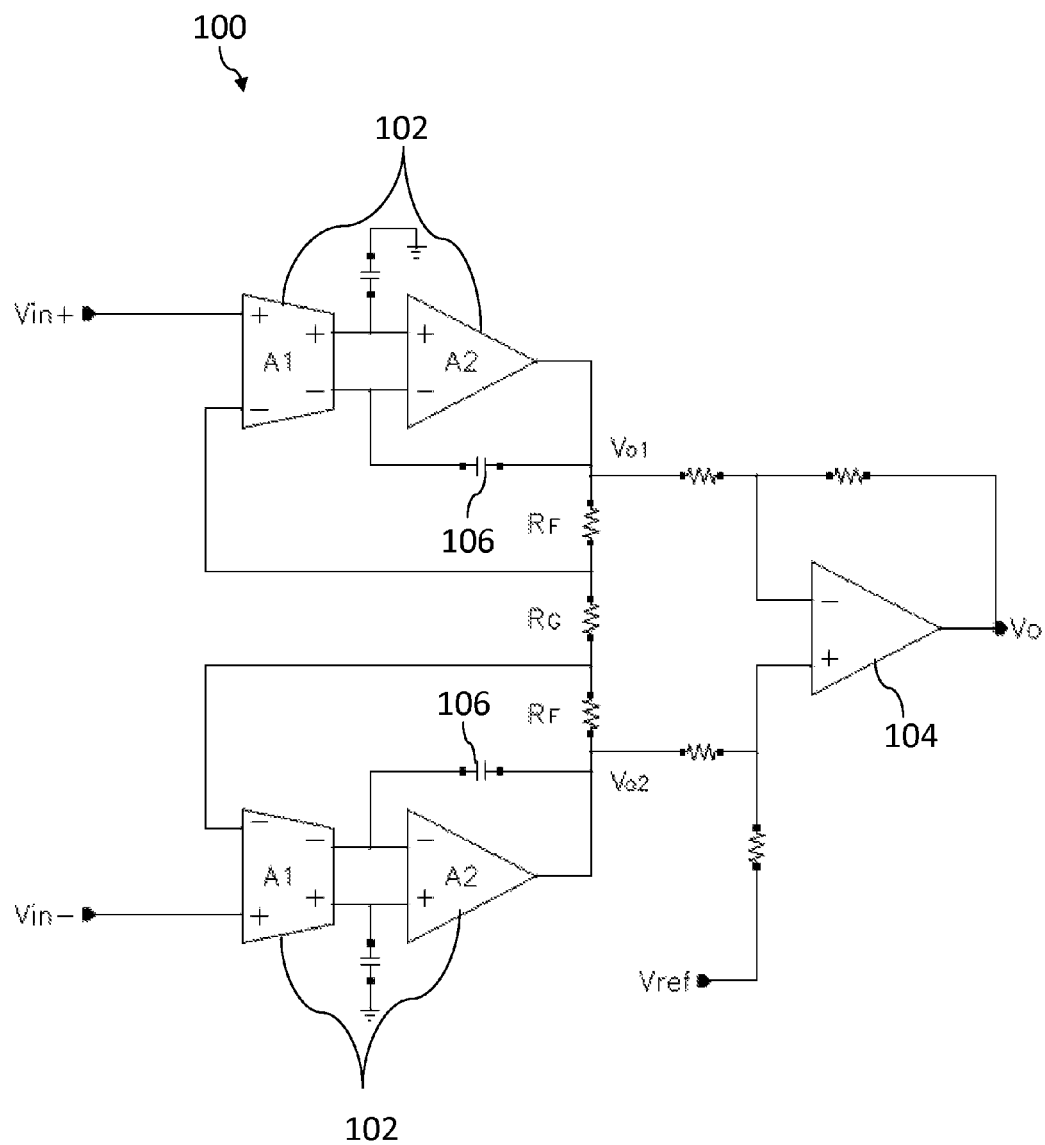
FIG. 1 illustrates a typical three op-amp instrumentation amplifier as known in the prior art.

A compensation capacitor 206 is connected between an intermediate node 208 and an inverting input terminal 210 of the first-level amplifier 202. By comparison, the compensation capacitor 106 of the amplifier of FIG. 1 is connected between the intermediate node and the output nodes $V_{o1}$, $V_{o2}$. The disposition of the compensation capacitor 206 in the circuit of FIG. 2 thus provides two feedback paths 212, 214 to the inverting input terminal 210. The first path 212 is the same as that in FIG. 1 (i.e., through the feedback resistor $R_F$). In the amplifier 200 of FIG. 2, the compensation capacitor 206 creates a second path 214, which allows the AC signal to be fed back from the intermediate node 208 to the inverting input terminal 210 without being attenuated by the resistor divider made with $R_G$ and $R_F$. In summary, this compensation technique feeds back a greater AC signal to the inverting input 210, which effectively extends the closed-loop bandwidth of the amplifier 200.

A more rigorous analysis of the benefits of the compensation capacitor 206 follows. The input amplifier 202 provides high input impedance, and the output stage 204 is configured as a difference amplifier with a gain of one. The gain of the entire amplifier circuit 200 is therefore given below by Equation (1).

$$\text{gain} = 1 + \frac{2R_F}{R_G} \tag{1}$$

Because the output amplifier 204 is configured to have a gain of one, its closed-loop bandwidth is fixed at approximately half of its unit-gain bandwidth, regardless of the gain settings of the entire amplifier 200. Therefore, the bandwidth of the amplifier 200 is usually limited by the bandwidth of the input amplifier 202. For example, assuming the input amplifier 202 has a unit-gain bandwidth of 100 kHz, at a gain of 1000, the closed-loop 3 dB bandwidth (i.e., cutoff frequency) of the amplifier 200 is reduced to 100 Hz (because, as noted above, its GBW is fixed, and 100 kHz÷1000=100 Hz).

In one embodiment, the input amplifier has two stages. The loop gain of a two-stage amplifier in negative feedback is $A_1 A_2 \beta$, wherein $A_1$ is the open-loop gain of the first stage, $A_2$ is the open-loop gain of the second stage, and $\beta$ is the feedback coefficient. The current invention is not limited, however, to only two-stage amplifiers; the same principle may be applied to multiple-stage amplifiers in feedback operation. The closed-loop bandwidth of the amplifier 100 shown in FIG. 1, with its conventional compensation capacitor 106, is equal to $\beta \times$GBW. The bandwidth reduction at a high-gain setting of the amplifier 100 of FIG. 1 is due to the reduction of the feedback coefficient $\beta$, because the output signal is attenuated by the resistor divider made with $R_F$ and $R_G$, then fed back to the inverting input.

Figure 3:
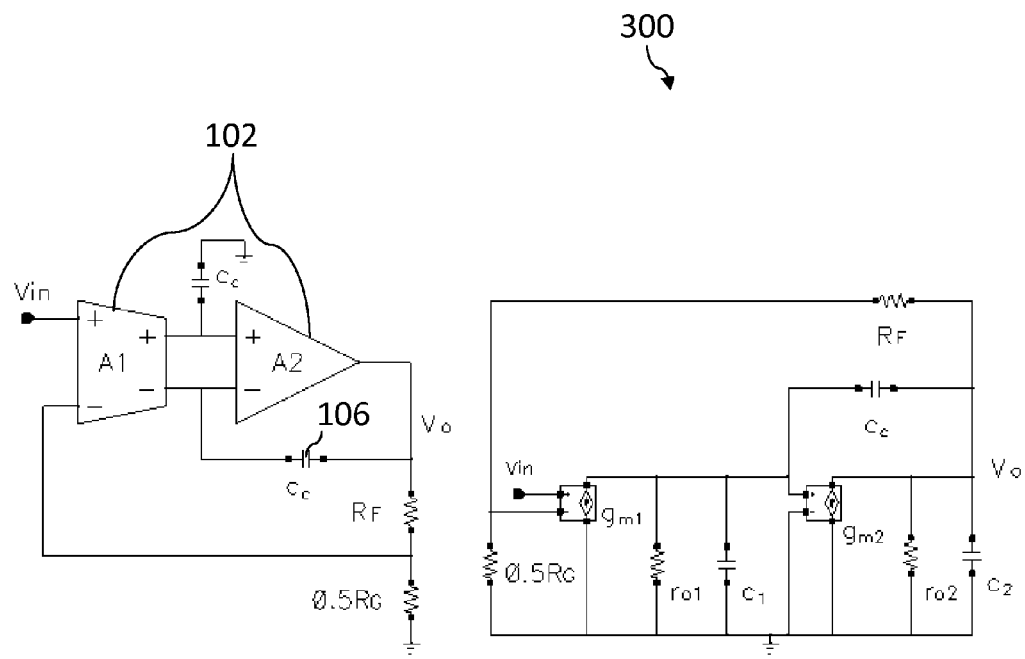
FIG. 3 illustrates a small-signal model of an amplifier as known in the prior art.
Figure 4:
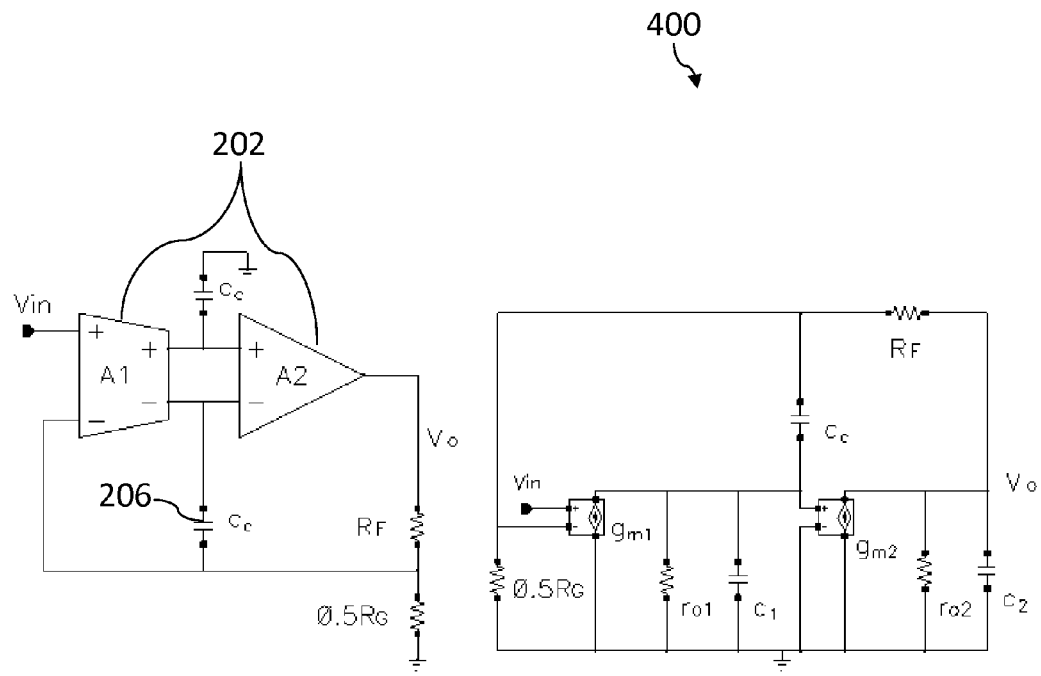
FIG. 4 illustrates a small-signal model of an amplifier in accordance with an embodiment of the invention.

The corresponding single-ended small-signal models 300, 400 of the input amplifiers 102, 202 are shown in FIG. 3 and FIG. 4, respectively. For simplicity, the below analysis assumes that the input amplifiers 102, 202 do not drive large-value external capacitances and that their internal parasitic capacitances (modeled with $c_1$ and $c_2$) are typically much less than the compensation capacitance $C_c$; these other capacitances are therefore omitted. As noted above, the loop gain at DC is given by $A_1 A_2 \beta$, as those terms are defined below by Equations (2)-(4), $$A_1 = g_{m1} r_{o1} \tag{2}$$

$$A_2 = g_{m2}\left[r_{o2} // \left(R_F + \frac{R_G}{2}\right)\right] = g_{m2} \frac{r_{o2}\left(R_F + \frac{1}{2}R_G\right)}{r_{o2} + R_F + \frac{1}{2}R_G} \tag{3}$$

$$\beta = \frac{\frac{1}{2}R_G}{R_F + \frac{1}{2}R_G} \tag{4}$$

in which $g_{m1}/r_{o1}$ and $g_{m2}/r_{o2}$ are the transconductance/output impedance of the first- and second-stage amplifiers, respectively, and $R_F$ and $R_G$ are feedback and gain setting resistors respectively, which form a resistive voltage divider as shown in the figures. The equivalent capacitance produced by the compensation capacitance $C_c$ is, due to the Miller effect, greater than $C_c$ and is given by Equation (5), $$C_{eq} = (1+k)C_c \tag{5}$$

in which k is the voltage gain across the compensation capacitor $C_c$. As one of skill in the art will understand, the Miller effect causes a capacitance at a first terminal of a capacitor to appear larger than it actually is if a voltage at the second terminal of the capacitor is changing in a direction opposite to that of the first terminal. Based on this value of the equivalent capacitance, the transfer function of the loop gain has a dominant pole $f_0$ given by Equation (6).

$$f_0 = \frac{1}{2\pi r_{o1}(1+k)C_c} \tag{6}$$

For the conventional compensation technique as shown in FIG. 3, k is equal to $A_2$; for the compensation technique of the current invention, as shown in FIG. 4, k is equal to $A_2 \beta$ due to the second feedback path 214 providing the additional dependence on β (i.e. the voltage gain across the capacitor is now reduced to be $A_2\beta$). Thus, for the conventional compensation technique of FIG. 3, substituting the appropriate values into Equation (6) yields a dominant pole $f_0$ and closed-loop 3 dB bandwidth or cutoff frequency $f_c$ as given by Equations (7) and (8).

$$f_0 = \frac{1}{2\pi r_{o1}(1+A_2)C_c} \quad (7)$$

$$f_c = A_1 A_2 \beta \frac{1}{2\pi r_{o1}(1+A_2)C_c} \quad (8a)$$

Because $A_2$ is usually much larger than 1, Equation (8a) may be simplified as shown in Equation (8b).

$$f_c = A_1 A_2 \beta \frac{1}{2\pi r_{o1} A_2 C_c} = \beta \frac{g_{m1} r_{o1}}{2\pi r_{o1} c_c} = \beta \frac{g_{m1}}{2\pi c_c} \quad (8b)$$

Substituting the above value of k for the compensation technique of the current invention into Equation (6) yields a dominant pole $f^*_0$ and closed-loop 3 dB bandwidth or cutoff frequency $f^*_c$ as given by Equations (9) and (10).

$$f^*_0 = \frac{1}{2\pi r_{o1}(1+A_2\beta)C_c} \quad (9)$$

$$f^*_c = A_1 A_2 \beta \frac{1}{2\pi r_{o1}(1+A_2\beta)C_c} \quad (10)$$

Thus, in each case, although the DC loop gain may be the same, the transfer function of the loop gain changes. Usually, $A_2\beta \gg 1$; the cutoff frequency $f^*_c$ may be thus approximated by the expression in Equation (11).

$$f^*_c \cong \frac{A_1 A_2 \beta}{2\pi r_{o1} A_2 \beta C_c} = \frac{g_{m1}}{2\pi C_c} \quad (11)$$

Therefore, the closed loop 3 dB bandwidth of the amplifier remains approximately constant at its unit gain bandwidth, regardless of the gain setting. Compared to the conventional compensation technique, the bandwidth is extended by a factor of 1/β.

The closed-loop bandwidth may start to drop in the case where $A_2\beta \ll 1$. This may happen if gain setting is very high, so that β is very small. The cutoff frequency $f^*_c$ may then be approximated by the expression in Equation (12).

$$f^*_c \cong \frac{A_1 A_2 \beta}{2\pi r_{o1} C_c} = A_2 \beta \frac{g_{m1}}{2\pi C_c} \quad (12)$$

Compared to the conventional compensation technique, the closed loop bandwidth is extended by a factor of $A_2$ in this case. In one embodiment, the amplifier 200 (as depicted in FIG. 2) is unit-gain stable (i.e., the amplifier is stable at gain of one and higher, as is typical of general-purpose amplifiers).

At a gain of one, the compensation technique of the present invention provides the widest possible bandwidth of $$\frac{g_{m1}}{2\pi C_c}$$

(in accordance with Equation (11) when β=1), which is the same as that of a conventional Miller compensation technique (e.g., the technique pictured in FIG. 1). The compensation technique of the current invention therefore extends the bandwidth of the amplifier 200 only if its gain is configured to be higher than one (i.e., gains at which the circuit of FIG. 1 would have reduced bandwidth). Therefore, the bandwidth extension of the present invention, because it does not extend unity gain bandwidth, does not deteriorate the stability of the amplifier.

Compared to the existing compensation technique of FIG. 1, in general, the bandwidth of the loop gain in FIG. 4 is extended by a factor of $$\frac{1+A_2}{1+A_2\beta}.$$

Figure 6:
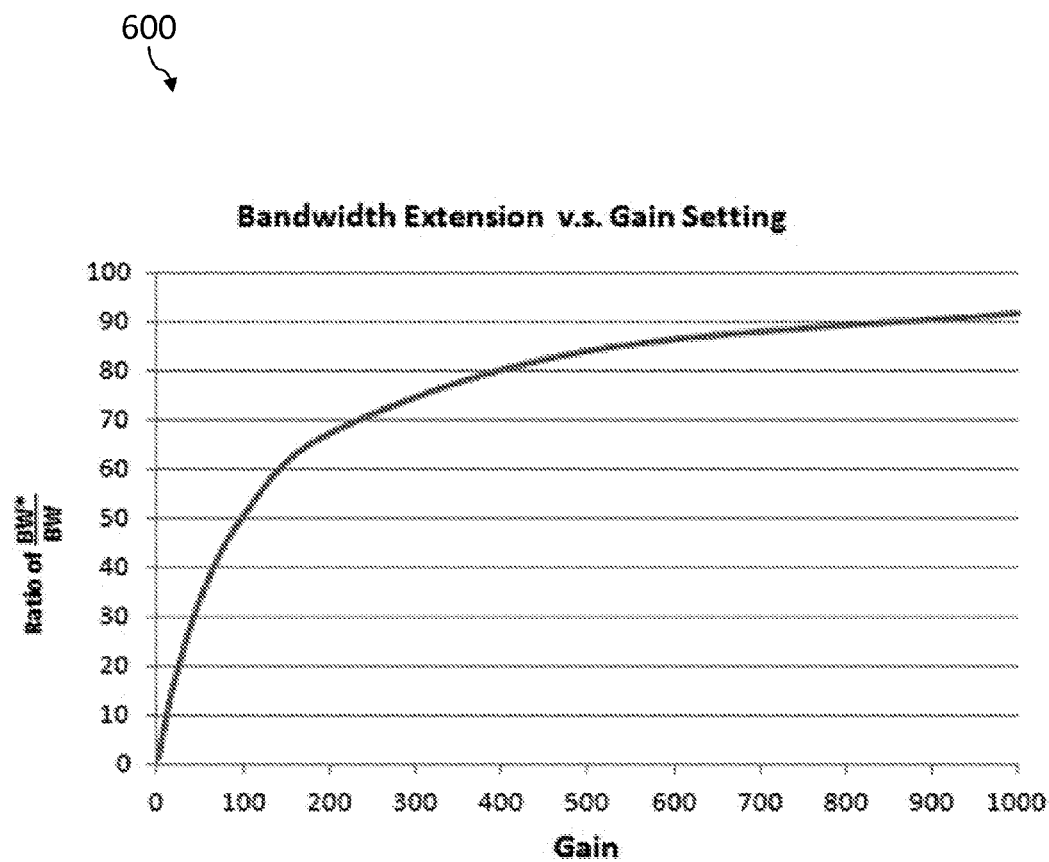
FIG. 6 is a graph of example bandwidth values in accordance with an embodiment of the invention.

As noted above, if the gain is unity (one), β=1, and the extension factor reduces to 1. As an example, assuming $R_F$=50 kΩ, $A_2$=100, and GBW=100 kHz, the effect of bandwidth extension under a variety of gain settings is given in the table 500 depicted in FIG. 5. "BW" represents the bandwidth under the conventional Miller compensation technique of FIG. 1, and "BW*" represents the bandwidth under the compensation technique of the present invention. As shown, when gain=1, the new bandwidth BW* does not differ from the old bandwidth BW, but as gain increases, BW falls off much more quickly than BW*. The ratio of BW* to BW is shown in a graph 600 appearing in FIG. 6.

The compensation technique of the present invention thus improves an amplifier's dynamic performance in at least two aspects. First, the amplifier 200 has a wider small-signal bandwidth than the existing amplifier 100 of FIG. 1 (as discussed above). Second, it eliminates, or at least alleviates, slew limitation during a large signal step response (in other words, the rate at which the output voltage can change in response to fast changes in the input voltage is not limited, or at least less limited, by internal limitations of the amplifier 200). This second benefit may be seen by noting that the compensation capacitor 106 of the conventional compensation scheme (shown in FIG. 3) always undergoes the full output-signal swing; the large-signal step response of the amplifier is therefore degraded by both the lower bandwidth and the limited slew rate. On the other hand, the compensation capacitor 206 in FIG. 4 sees only the input signal swing, which is equal to the output swing divided by the closed loop gain. For example, assuming that the closed loop gain is set at 100 and a 40 mV step input is applied, the output is expected to have a 4 V step. In FIG. 3, the voltage across the compensation capacitor 106 has to change by 4 V. In FIG. 4, however, the voltage across the compensation capacitor 206 only needs to change by 40 mV. With less "distance" to travel, the voltage swing across the compensation capacitor 206 settles much faster, which means the amplifier output settles much faster under large signal step.

Figure 7:
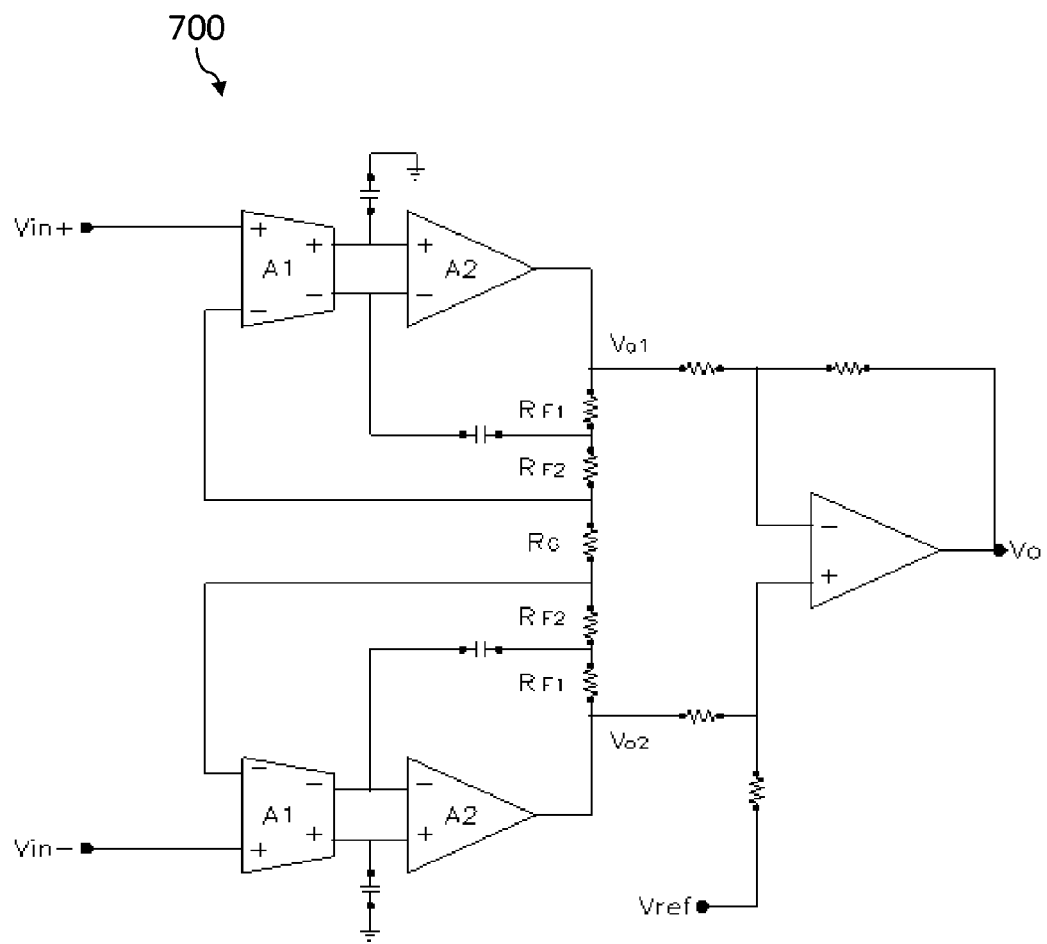
FIG. 7 is another embodiment of a feedback circuit for an amplifier in accordance with an embodiment of the invention.
Figure 8:
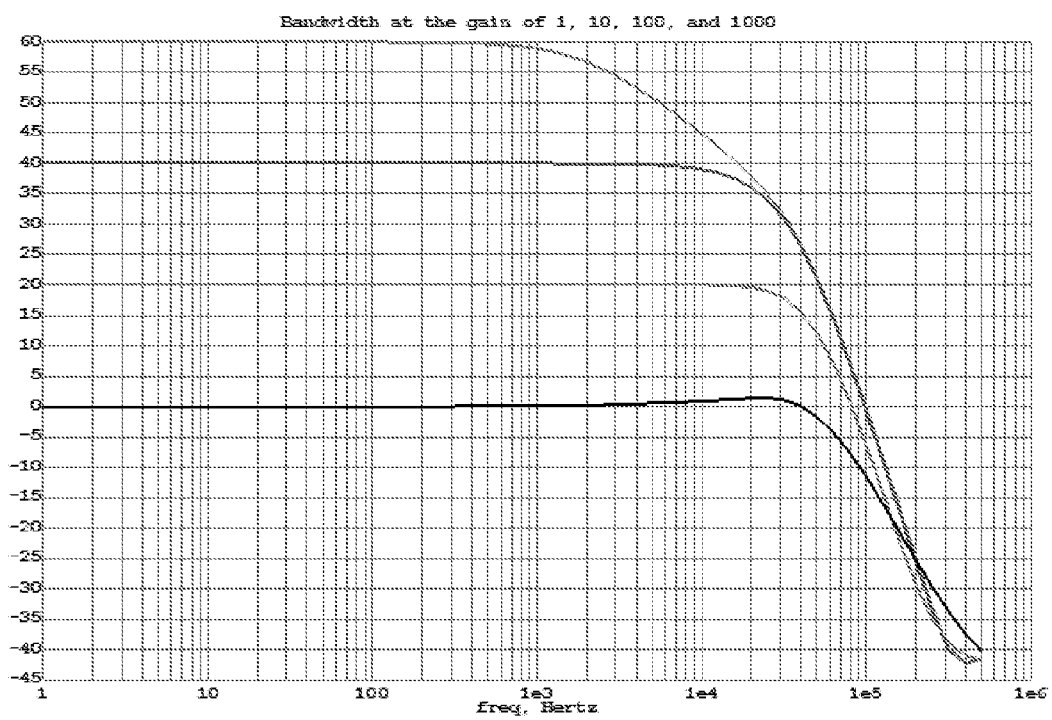
FIG. 8 is a graph of bandwidth values for a feedback circuit for an amplifier in accordance with an embodiment of the invention.
Figure 9:
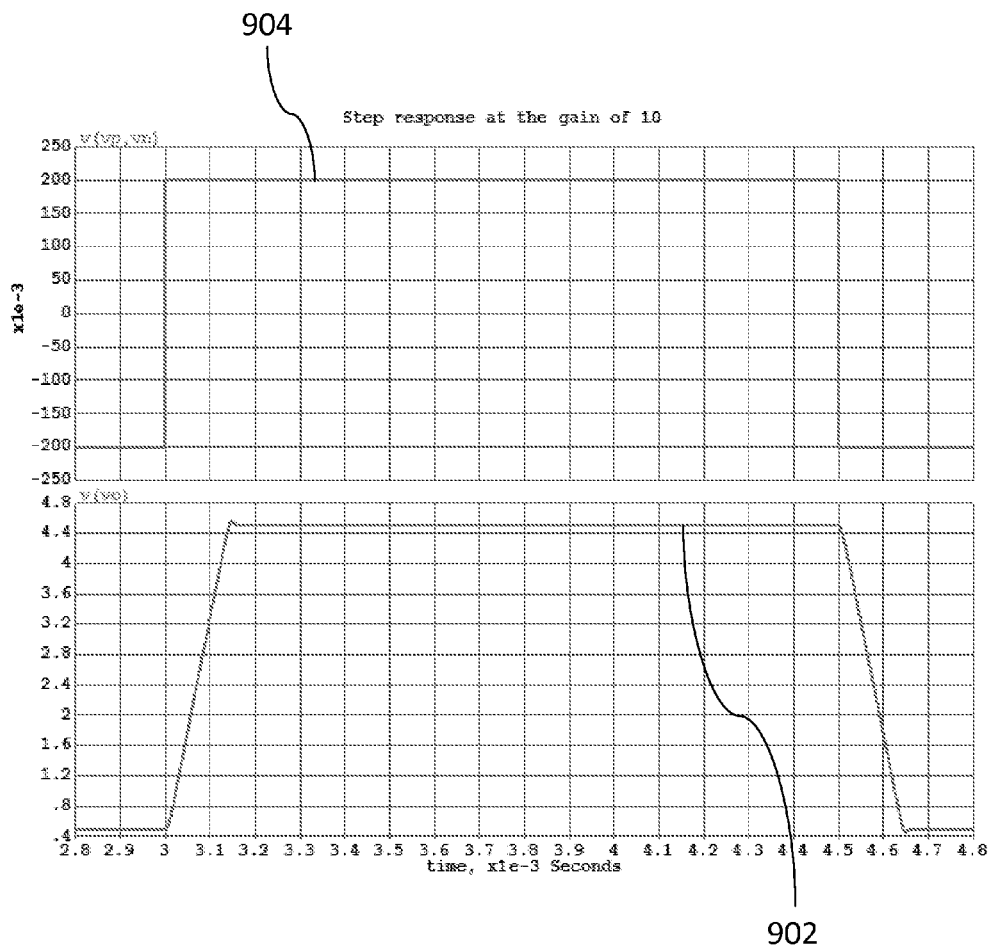
FIGS. 9 and 10 are graphs of step responses for feedback circuits in accordance with embodiments of the invention.
Figure 10:
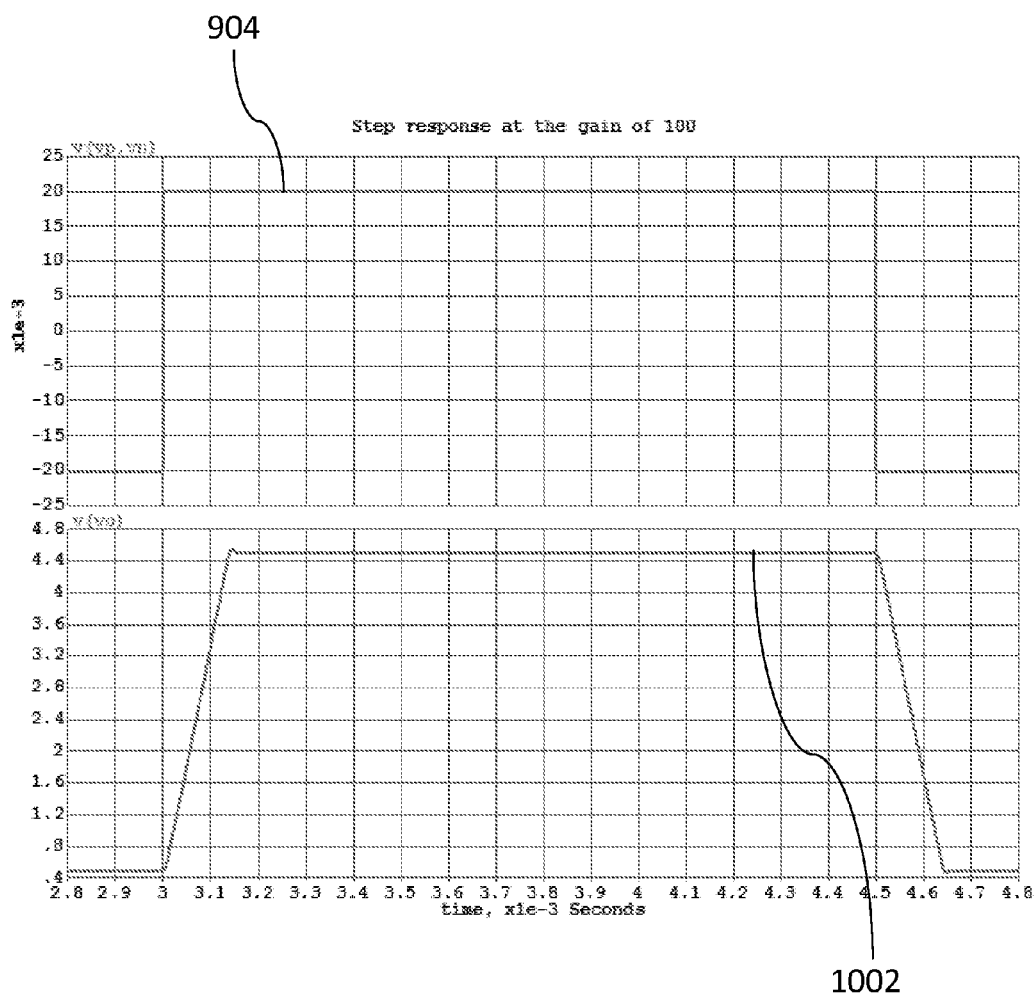

FIG. 7 illustrates another embodiment 700 of the invention disposed in a resistor-programmable ultra-low-power instrumentation amplifier. In this design, $R_F$ is split into two components: $R_{F1}$ (which may be approximately 49 kΩ) and $R_{F2}$ (which may be approximately 1 kΩ). By adjusting the ratio of $$\frac{R_{F2}}{R_{F1}},$$

a tradeoff between speed and noise may be made to best suit specific applications. In this design, the bandwidth is extended to 15 kHz at a gain setting of 100; noise is suppressed beyond that frequency. The circuit's bandwidth-versus-gain settings are shown in FIG. 8. The bandwidth BW* at the gains of 1, 10, 100, and 1000 are approximately equal to 50 kHz, 35 kHz, 17 kHz, and 1.8 kHz respectively. The large-signal (e.g., 4 V) responses 902, 1002 of a step input 904 of the circuit 700 at gains of 10 and 100 is shown in FIGS. 9 and 10, respectively.

Figure 11:
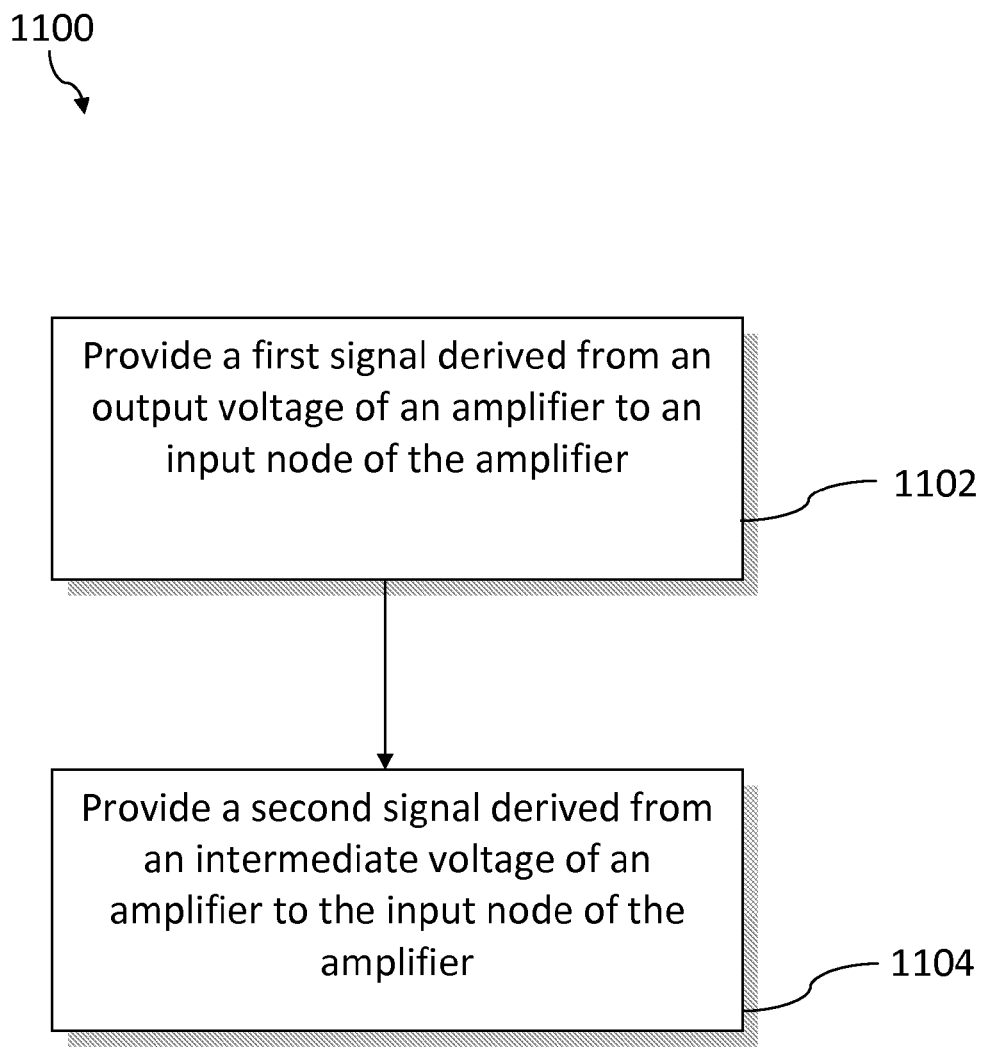
FIG. 11 is a flowchart of a method of operating an amplifier in accordance with an embodiment of the invention.

FIG. 11 illustrates a method 1100 for extending a bandwidth of a voltage-feedback amplifier. In a first step 1102, a first signal (e.g., the signal provided by the first path 212) is derived from an output voltage (e.g., $V_o$) of an amplifier is provided to an input node of the amplifier (e.g., the inverting input 210). In a second step 1104, a second signal (e.g., the signal provided by the second path 214) is derived from an intermediate voltage (e.g., the voltage on the intermediate node 208) of the amplifier and provided to an input node (e.g., the inverting input 210) of the amplifier. The second signal increases a bandwidth of the feedback amplifier as a gain of the amplifier increases because it adds a feedback path for AC signal such that the AC signal can be directly feedback to the amplifier input without being attenuated by the resistor divider.

What is claimed is:

1. A system configured to extend a bandwidth and to improve slew behavior of a feedback amplifier, the system comprising:
    a first amplifier comprising at least a first stage and a second stage, the first stage having at least a non-inverting input node configured to receive an input signal and an inverting input node, the second stage having at least an output node, a non-inverting intermediate node and an inverting intermediate node;
    a first negative feedback path comprising a feedback resistance operatively coupled in a signal path between the output node and the inverting input node, the feedback resistance comprising a first resistor and a second resistor arranged in series; and
    a second negative feedback path comprising a compensation capacitor, the compensation capacitor operatively coupled in a signal path between the inverting intermediate node and a common node of the series-coupled first and second resistors, wherein the second negative feedback path shares a portion of the first negative feedback path comprising the first resistor.

2. The system of claim 1, wherein the speed of the first amplifier is based at least in part on a ratio of the first and second resistors.

3. The system of claim 1, wherein a closed-loop 3 dB bandwidth of the first amplifier remains approximately constant at its unit-gain bandwidth regardless of a gain setting of the first amplifier.

4. The system of claim 1, wherein a closed-loop 3 dB bandwidth is extended by a factor of $$\frac{1+A_2}{1+A_2\beta},$$

wherein β is the feedback coefficient of the feedback amplifier and $A_2$ is a gain between the intermediate node and output node.

5. The system of claim 1, further comprising a second amplifier configured to amplify and/or to buffer the output voltage on the output node.

6. The system of claim 1, further comprising a gain-setting resistor, wherein a signal derived from the output voltage and a closed loop gain of the first amplifier is based at least in part on a ratio of the gain-setting resistor and the feedback resistance.

7. The system of claim 5, wherein the first amplifier and the second amplifier comprise instrumentation amplifiers.

8. The system of claim 5, wherein the second amplifier comprises a unity gain amplifier.

9. The system of claim 1, wherein the first amplifier is comprises a differential amplifier.

10. The system of claim 1, wherein the first amplifier comprises an operational amplifier.

11. The system of claim 1, wherein the first stage is configured to amplify the input voltage on the non-inverting input node to produce an intermediate voltage on the inverting and non-inverting intermediate nodes and the second stage is configured to amplify the intermediate voltage to produce the output voltage.

12. A method extend a bandwidth of a feedback amplifier, the method comprising:
    providing a first negative feedback path comprising a feedback resistance operatively coupled in a signal path between an output node of a first amplifier and an inverting input node of the first amplifier, the feedback resistance comprising a first resistor and a second resistor coupled in series; and
    providing a second negative feedback path comprising a compensation capacitor, the compensation capacitor operatively coupled in a signal path between an inverting intermediate node of the first amplifier and a common node of the series coupled first and second resistors, wherein the second negative feedback path shares a portion of the first negative feedback path comprising the first resistor.

13. The method of claim 12, further comprising providing a high input impedance in the first amplifier and a unity gain in a second amplifier configured to buffer the output voltage at the output node of the first amplifier.

14. The method of claim 12, further comprising adjusting a gain of the feedback amplifier.

15. The method of claim 14, wherein adjusting the gain comprises adjusting a resistance of a gain-setting resistor.

* * * * *

UNITED STATES PATENT AND TRADEMARK OFFICE
CERTIFICATE OF CORRECTION

PATENT NO. : 8,723,604 B2
APPLICATION NO. : 13/464311
DATED : May 13, 2014
INVENTOR(S) : Wan

It is certified that error appears in the above-identified patent and that said Letters Patent is hereby corrected as shown below:

In the Claims:

In column 8 at line 36 (approx.), In Claim 12, change "extend" to --to extend--.

Signed and Sealed this
Twenty-eighth Day of October, 2014

Michelle K. Lee
*Deputy Director of the United States Patent and Trademark Office*